(12) United States Patent
Hill

(10) Patent No.: US 6,500,730 B1
(45) Date of Patent: Dec. 31, 2002

(54) METHOD FOR FILLING STRUCTURAL GAPS AND INTEGRATED CIRCUITRY

(75) Inventor: Chris W. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/715,378

(22) Filed: Nov. 17, 2000

Related U.S. Application Data

(63) Continuation of application No. 09/432,496, filed on Nov. 2, 1999, now Pat. No. 6,171,948.

(51) Int. Cl.[7] .............................................. H01L 21/76
(52) U.S. Cl. ..................... 438/439; 438/435; 438/424; 438/592
(58) Field of Search ............................... 438/439, 435, 438/424, 592

(56) References Cited

U.S. PATENT DOCUMENTS

| | | | |
|---|---|---|---|
| 5,100,826 A | 3/1992 | Dennison | |
| 5,399,389 A | 3/1995 | Hieber et al. | |
| 5,681,425 A | 10/1997 | Chen | |
| 5,741,740 A | * 4/1998 | Jang et al. | 438/435 |
| 5,783,482 A | 7/1998 | Lee et al. | |
| 5,981,333 A | 11/1999 | Parekh et al. | |
| 6,033,981 A | 3/2000 | Lee et al. | |
| 6,057,205 A | 5/2000 | Wu | |
| 6,090,686 A | * 7/2000 | Brady et al. | 438/439 |
| 6,156,637 A | 12/2000 | Sonego et al. | |
| 6,211,040 B1 | * 4/2001 | Liu et al. | 438/424 |
| 6,217,357 B1 | * 4/2001 | Masuoka | 439/199 |
| 6,313,021 B1 | * 11/2001 | Merchant et al. | 438/592 |

FOREIGN PATENT DOCUMENTS

| | | | |
|---|---|---|---|
| EP | 599317 A1 | 1/1994 | |
| EP | 0 677 869 A1 | * 10/1995 | ....... H01L/21/3105 |
| JP | 7013044 A | 5/1995 | |

OTHER PUBLICATIONS

Elbel; Gabric; Langheinrich; and Neureither, "A New STI Process Based on Selective Oxide Deposition," Seimens AG, Semiconductor Group, Section 1739 Munich, Germany; SIMEC, 01099 Dresden, Germany.

* cited by examiner

Primary Examiner—Caridad Everhart
Assistant Examiner—V. Yevsikov
(74) Attorney, Agent, or Firm—Wells St. John P.S.

(57) ABSTRACT

A semiconductor processing method for filling structural gaps includes depositing a substantially boron free silicon oxide comprising material at a first average deposition rate over an exposed semiconductive material in a gap between wordline constructions and at a second average deposition rate less than the first average deposition rate over the wordline constructions. A reduced gap having a second aspect ratio less than or equal to a first aspect ratio of the original gap may be provided. An integrated circuit includes a pair of wordline constructions separated by a gap therebetween in areas where the wordline constructions do not cover an underlying semiconductive substrate. A layer of substantially boron free silicon oxide material has a first thickness over the substrate within the gap and has a second thickness less than the first thickness over the wordline constructions.

20 Claims, 3 Drawing Sheets

US 6,500,730 B1

METHOD FOR FILLING STRUCTURAL GAPS AND INTEGRATED CIRCUITRY

RELATED PATENT DATA

This patent resulted from a continuation application of U.S. patent application Ser. No. 09/432,496, filed on Nov. 2, 1999, now U.S. Pat. No. 6,171,948.

TECHNICAL FIELD

This invention concerns semiconductor processing methods for filling structural gaps and integrated circuitry having filled structural gaps.

BACKGROUND OF THE INVENTION

In semiconductor wafer processing, device structures are formed on a semiconductor substrate. FIG. 6 illustrates a wafer fragment 600 comprising a bulk substrate 45 having a pair of wordline constructions 60 formed thereon. A gate oxide 15, gate conductor 20, cap 25, and spacers 30 comprise the individual structural components of wordline constructions 60. Often, it is desirable to form a layer of insulation material over the device structures formed on a semiconductor wafer, such as substrate 45. An insulation layer 640 on wafer portion 600 may be formed by depositing borophosphosilicate glass (BPSG) and reflowing the deposited insulation material to densify and planarize insulation layer 640.

Before forming insulation layer 640, a gap exists in areas where substrate 45 is not covered by device structures, like wordline constructions 60. Such a gap may expose substrate 45 to boron and/or phosphorous diffusion from the BPSG in insulation layer 640. A barrier layer 635 is often formed over device structures prior to formation of insulation layer 640 to counteract such boron and/or phosphorous diffusion. Unfortunately, barrier layer 635 forms a reduced gap within the original gap that has a higher aspect ratio than the original gap. When the aspect ratio of a gap between device structures is sufficiently high, it may cause formation of voids, such as a void 650, in insulation layer 640 during deposition. It is highly desirable to form insulation layer 640 such that it fills the reduced gap between wordline constructions 60 without formation of void 650.

Accordingly, barrier layer 635 addresses the problem of boron and/or phosphorous diffusion, but exacerbates the problem of void formation. Thus, a need exists to provide a method for protecting against boron and/or phosphorous diffusion while reducing the likelihood of forming voids in structural gaps. Otherwise, semiconductive substrates may either suffer defects resulting from boron and/or phosphorous diffusion or defects resulting from formation of voids.

While motivated from this perspective, the artisan will appreciate other applicabilities, with the invention only being limited by the accompanying claims appropriately interpreted in accordance with The Doctrine of Equivalents.

SUMMARY OF THE INVENTION

According to one aspect of the invention, a semiconductor processing method for filling structural gaps includes depositing a substantially boron free silicon oxide comprising material at a first average deposition rate over an exposed semiconductive material in a gap between wordline constructions and at a second average deposition rate less than the first average deposition rate over the wordline constructions. A reduced gap having a second aspect ratio less than or equal to a first aspect ratio of the original gap may be provided. A layer of a boron containing silicon oxide material may be deposited on the substantially boron free silicon oxide material and over the wordline constructions. The boron containing silicon oxide material may be deposited in situ in the same chamber.

According to another aspect of the invention, an integrated circuit includes a pair of wordline constructions separated by a gap therebetween in areas where the wordline constructions do not cover an underlying semiconductive substrate. A layer of substantially boron free silicon oxide material has a first thickness over the substrate within the gap and has a second thickness less than the first thickness over the wordline constructions. A layer of boron containing silicon oxide material is over the substantially boron free silicon oxide comprising material.

Other aspects are, of course, contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
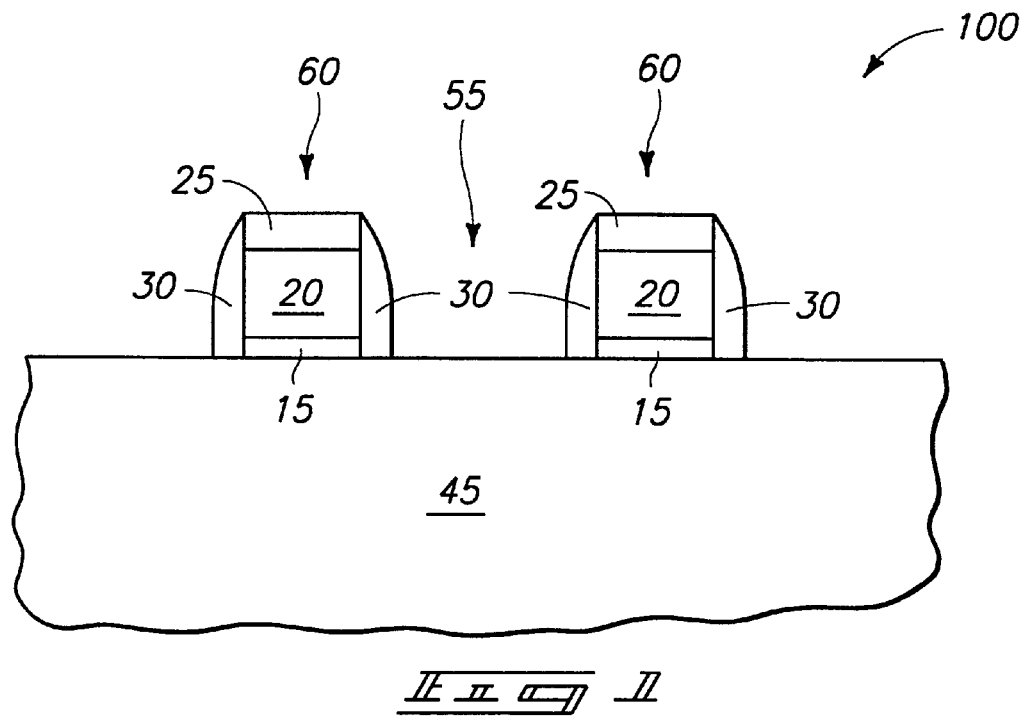
FIG. 1 is an enlarged sectional view of a wafer portion at one processing step.
Figure 5:
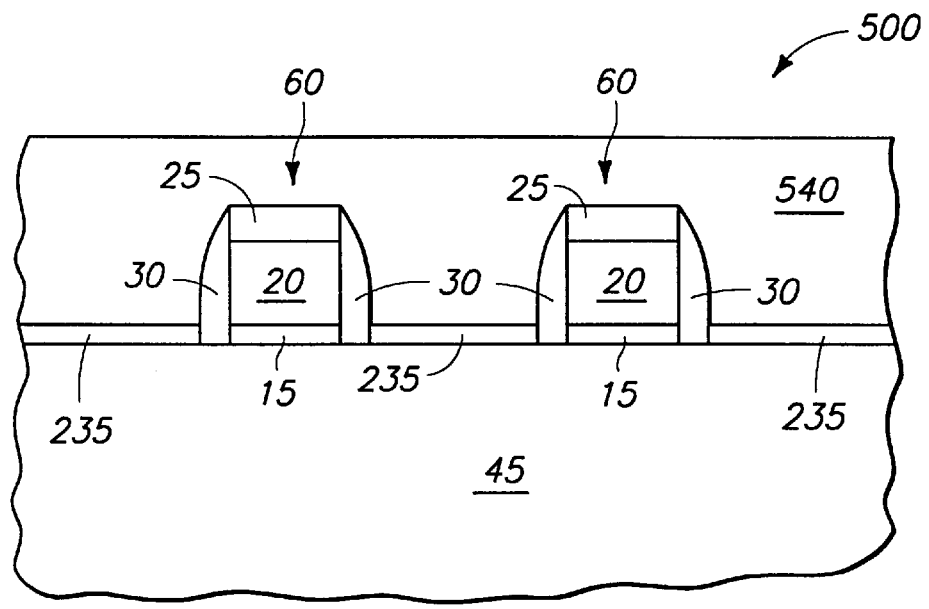
FIG. 5 is an enlarged sectional view of the wafer portion in FIG. 2 at a subsequent processing step.

FIG. 5 depicts a semiconductive wafer portion 500 of an integrated circuit according to one aspect of the present invention. Wafer portion 500 includes a semiconductive substrate 45 on which a pair of wordline constructions 60 have been formed. In the context of this document, the term "semiconductor substrate". or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Each wordline construction 60 includes a layer of gate oxide 15, a gate conductor 20, an insulative cap 25, and spacers 30 formed on the sidewalls of gate oxide 15, gate conductor 20, and cap 25. Spacers 30 may be formed from a nitride insulating material, such as silicon nitride, among other materials. FIG. 1 illustrates wafer portion 100, which may be wafer portion 500 at an earlier point in processing. Notably, a gap 55 in wafer portion 100 exists between wordline constructions 60 in an area where wordline constructions 60 do not cover substrate 45.

In wafer portion 500, gap 55 has been lined with a substantially boron free silicon oxide comprising material 235 to form a reduced gap 255 (shown in FIG. 2) which is, in turn, filled with insulation layer 540 of wafer portion 500. In the context of this document, "substantially boron free" and "boron free" mean a boron concentration from 0 atoms/$cm^3$ to no greater than $10^{16}$ atoms/$cm^3$. Example materials include undoped silicon dioxide deposited by decomposition of tetraethylorthosilicate (TEOS), phosphosilicate glass (PSG), or other silicon oxide comprising materials.

Even though PSG can be substantially boron free, it may be desirable in some applications instead to avoid phosphorous diffusion into substrate 45. Also, it may be desirable to avoid both boron and phosphorous diffusion. Accordingly, a substantially phosphorous free or a substantially dopant free silicon oxide comprising material can be used instead of a substantially boron free material. In the context of this document, "substantially phosphorous free" and "phosphorous free" mean a phosphorous concentration from 0 atoms/$cm^3$ to no greater than $10^{16}$ atoms/$cm^3$. Similarly, in the context of this document, "substantially dopant free," "dopant free," and "undoped" mean a boron concentration from 0 atoms/$cm^3$ to no greater than $10^{16}$ atoms/$cm^3$ and a phosphorous concentration from 0 atoms/$cm^3$ to no greater than $10^{16}$ atoms/$cm^3$.

Insulation layer 540 is received on boron free material 235 and may comprise a boron containing, silicon oxide comprising material, such as borophosphosilicate glass (BPSG) or other silicon oxide comprising materials. In the context of this document, "boron containing" shall mean a boron concentration of greater than $10^{16}$ atoms/$cm^3$. Insulation layer 540 may be reflowable under conditions similar to those under which BPSG is conventionally reflowed.

In the process of forming an integrated circuit, a device structure, such as one of the pair of wordline constructions 60 in FIG. 1, are often covered by a material such as insulation layer 540 to protect the device structure. If insulation layer 540 is boron containing, then a risk exists that boron from insulation layer 540 will diffuse into substrate 45. The boron may affect the operation of devices formed on substrate 45, such as the pair of wordline constructions 60 or other device structures. To prevent against such diffusion, it is preferable to form a structure to act as a barrier layer, such as boron free material 235, preventing boron diffusion into substrate 45.

Figure 6:
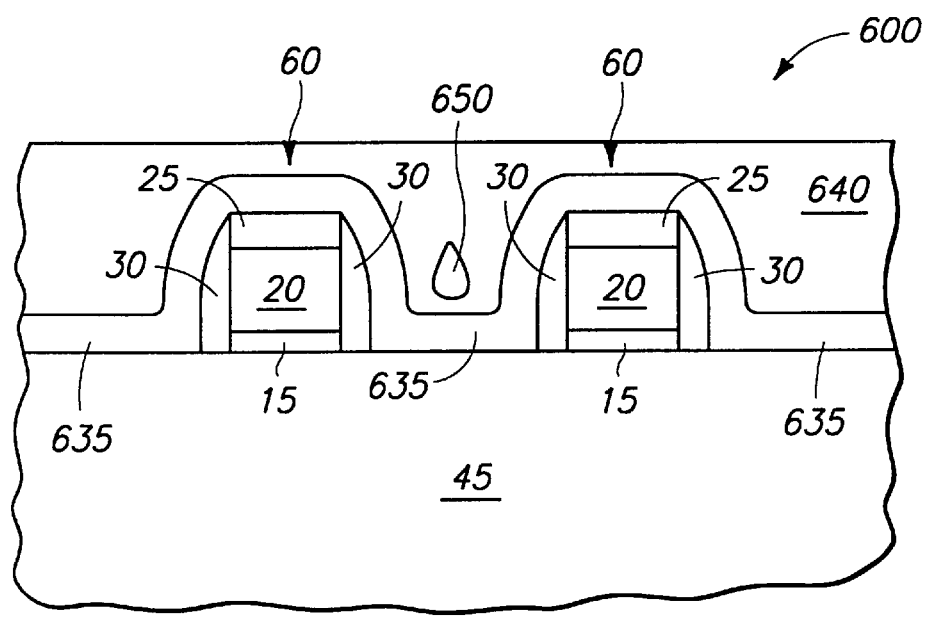
FIG. 6 is an enlarged sectional view of a prior art wafer portion.

Previously, barrier layers increased the aspect ratio of gaps between device structures, as in FIG. 6, causing void 650 to form during deposition of insulation layer 640. FIG. 6 illustrates this problem along with its associated text above. Fortunately, the structure of boron free material 235 in FIG. 5 does not increase the aspect ratio of gap 55 between wordline constructions 60. That is, boron free material 235 has a first thickness in the area over substrate 45 in gap 55 and a second thickness less than the first thickness over wordline constructions 60. In FIG. 5, the second thickness over the wordline constructions is zero, however, zero thickness is not required.

It will be appreciated that boron free material 235, spacers 30, cap 25, gate conductor 20, and gate oxide 15 may possess a variety of structures other than the specific structures in FIGS. 1 and 5 and yet accomplish their individual functions. For example, wafer portion 100 includes a bottom border of gap 55 between wordline constructions 60 that is defined entirely by substrate 45. Wafer portion also includes side borders of gap 55 that are defined entirely by spacers 30. However, a variety of other configurations are conceivable wherein the bottom border of gap 55 is not defined entirely by substrate 45 and/or where side borders of gap 55 are not defined entirely by spacers 30.

FIG. 5 also indicates that the first thickness of boron free material 235, that is, the thickness in the area over substrate 45 in gap 55, is less than the height of gap 55. Accordingly, boron free material 235 does not completely fill gap 55. It is conceivable, according to an alternative embodiment of the present invention, that the substantially boron free silicon oxide comprising material could completely fill gap 55. It could even exceed the height of gap 55.

Although a variety of configurations are possible for wordline constructions 60, it is preferred that at least a majority portion of each side wall of gap 55 is lined with silicon nitride, even though it is not required. FIG. 5 further shows that the boron containing silicon oxide comprising material of insulation layer 540 is received on boron free material 235. However, it is conceivable that a structure may include insulation layer 540 positioned over boron free material 235, but not received on boron free material 235. It is preferred that substrate 45 be a semiconductive material, such as silicon, but other semiconductive materials may also be appropriate.

Another aspect of the present invention further provides a variety of semiconductor processing methods for filling structural gaps. Turning to FIG. 1, such methods may include providing a pair of wordline constructions 60 over substrate 45 of semiconductive material. Wordline constructions 60 may be separated by a gap 55 exposing the semiconductive material of substrate 45 therebetween. An exemplary wafer portion 100 is illustrated in FIG. 1 and includes all of the elements of wafer portion 500-shown in FIG. 5, except for boron free material 235 and insulation layer 540.

As an alternative to wordline constructions 60 of wafer portion 100, some other device structure could be formed on substrate 45 to provide a gap 55. Gap 55 may be at least partially bordered by silicon nitride but expose underlying substrate 45. Understandably, a variety of other configurations are conceivable that would provide a structure in keeping with the above description.

Next, a substantially boron free silicon oxide comprising material may be deposited in gap 55 without increasing the aspect ratio of gap 55. In conventional processes for forming barrier layers the aspect ratio increase produced voids in subsequently deposited insulation layers. It is an advantage of the present invention that a deposition technique is provided that deposits the required material substantially selectively, at least initially. In the context of this document, "substantially selectively" shall refer to a deposition ratio on the desired versus the undesired surface of greater than 1 to 1. For example, the deposition ratio may be at least 1.5 to 1. Deposition may occur on semiconductive material, such as silicon, in preference to other material that may be used to form wordline constructions 60, such as silicon nitride. Selectivity may depend on the process conditions and the composition of underlying materials receiving the deposited composition.

The selectivity ratio of deposition may be initially 10 to 1 or even higher. This selectivity ratio may be maintained throughout the formation of boron free material or, in the alternative, the selectivity ratio may decrease after a time delay. For example, after a time delay of greater than 5 seconds (sec), the deposition rate over wordline constructions 60 may increase such that the selectivity ratio is less than 10 to 1. Such deposition rate may even increase sufficiently to match the deposition rate over portions of substrate 45 exposed through gap 55, yielding a later selectivity ratio of 1 to 1. More preferably, the time delay is greater than 100 sec.

Accordingly, the deposition may occur at a first deposition rate over the silicon of substrate 45 within gap 55 and at a second deposition rate over wordline constructions 60. At least initially, the first deposition rate may be greater than the second deposition rate. In this manner, formation of boron free material may produce a reduced gap having an aspect ratio less than or equal to the aspect ratio of gap 55 of wafer portion 100. Prior processes for forming barrier layers often produced a reduced gap having an increased aspect ratio in comparison to the original aspect ratio.

It is possible that the deposition rate over wordline constructions 60 may increase after a time delay to match the deposition rate over exposed substrate 45 within the gap. However, in one aspect of the invention, distinction may still be made as to average deposition rate over the respective areas. That is, a first average deposition rate over exposed semiconductive material in gap 55 may be greater than a second average deposition rate over wordline constructions 60 or other device structures. This is because the second average deposition rate would include in its calculation the initial period wherein deposition occurred substantially selective to substrate 45.

It is theorized that nucleation of deposition products takes place more readily on a semiconductive substrate, such as silicon, as compared to nucleation on a wordline construction or other device structure, such as a silicon nitride surface. Thus, since a delay in the nucleation occurs on device structure, a time delay in beginning formation of boron free material results. It has also been established that nucleation may be encouraged when a silicon surface is pre-cleaned with hydrofluoric acid.

The various deposition techniques described above may be conducted in a thermal chemical vapor deposition chamber or other processing chambers that achieve the stated advantages. As one example, the processing chamber may be a thermal chemical vapor deposition, cold wall, single wafer processor and may be used both to deposit boron free material, as well as a doped insulation layer, such as BPSG. Also, a sub-atmospheric chemical vapor deposition (SACVD) technique may be particularly suitable to producing the desired deposition effects.

Using one such SACVD technique, deposition rates of approximately 60 Angstroms per minute (Å/min) over a silicon substrate were obtained for undoped silicon dioxide. The deposition rate over silicon nitride during the same deposition was initially approximately 0 Å/min for a time delay of about 100 sec. After the initial time delay, the instantaneous deposition rate over silicon nitride increased to match the average deposition rate over the silicon substrate. However, due to the initial deposition rate of approximately zero, the average deposition rate over silicon nitride remained less than the average deposition rate over silicon.

The process conditions needed to produce such a deposition may vary depending upon the particular deposition chamber, composition of the substrates, composition of the deposition reactants, and other factors. Generally, however, SACVD may occur at a pressure in the deposition chamber of about 400 to 760 Torr or, more specifically, at a pressure of about 500 to 600 Torr. Temperature may be about 350 to 600 degrees Celsius (° C.) or, more specifically, about 450° C. As pressure is decreased within the range indicated, selectivity will tend to decrease. Also, as temperature is decreased within the range indicated, the deposition rate will tend to similarly decrease.

One example of possible deposition reactants includes a combination of tetraethylorthosilicate (TEOS) and an ozone and oxygen ($O_3/O_2$) comprising gas. Liquid TEOS may be injected into a deposition chamber at about 200 to 800 milligrams per minute (mg/min) using a vaporizer with a helium carrier or, more specifically, at about 300 mg/min. Alternatively, a carrier gas, such as helium, may be bubbled through liquid TEOS to produce the needed flow into a deposition chamber. TEOS temperature may be approximately 50 to 80° C. and the helium carrier flow rate may be approximately 0.5 to 1 slm. The ozone and oxygen comprising gas may include approximately 12 weight percent (wt %) ozone in oxygen. The gas may be fed to a deposition chamber at about 3 to 7 standard liters per minute (slm) or, more specifically, about 5 slm. The $O_3/O_2$ may include a diluent, such as helium, at about 5 to 9 slm or, more specifically, about 7 slm. Deposition rates on a semiconductive substrate, such as silicon, may vary between about 50 to 300 Å/min, but could be even higher.

Instead of substantially selectively depositing an undoped silicon dioxide, PSG may be deposited substantially selectively. By using a mixture of triethylphosphate (TEPO) and TEOS, a layer of PSG having about 3–8 wt % phosphorous may be deposited substantially selectively. Flowing of the TEPO into a deposition chamber may occur similarly to the methods described above. However, the flow rate of TEPO may be approximately 20 to 150 mg/min. The general deposition conditions for SACVD described above also apply.

Figure 2:
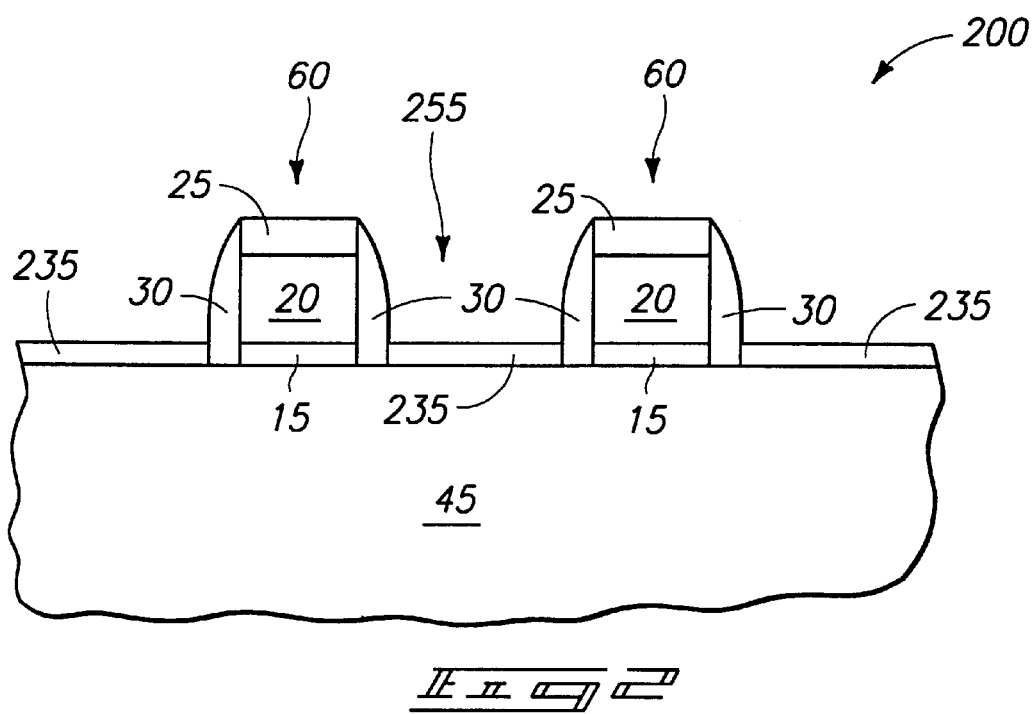
FIG. 2 is an enlarged sectional view of the wafer portion in FIG. 1 at a subsequent processing step.
Figure 3:
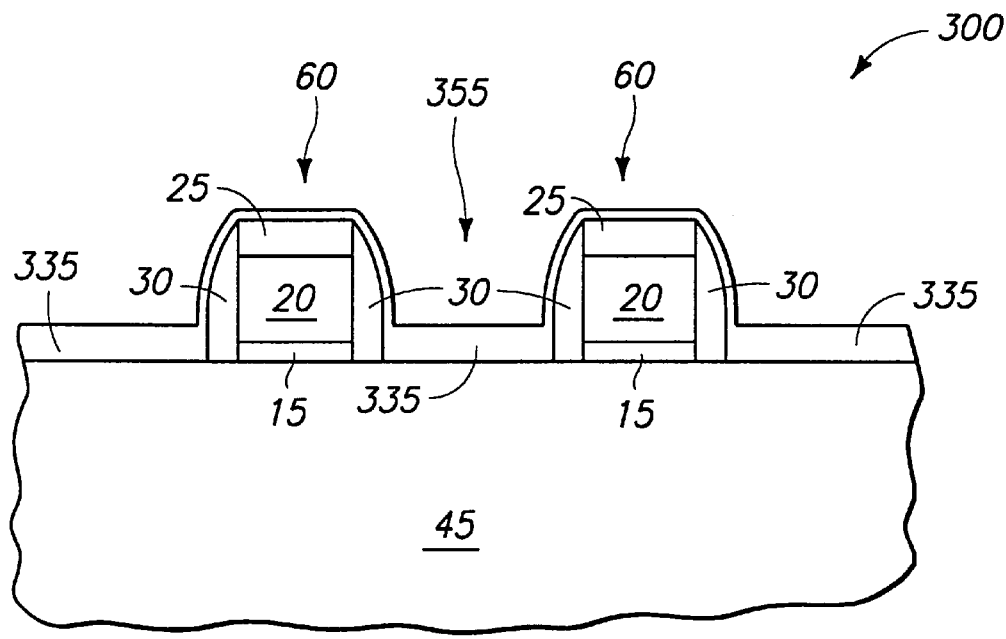
FIG. 3 is an enlarged sectional view of the wafer portion in FIG. 1 at a subsequent processing step.
Figure 4:
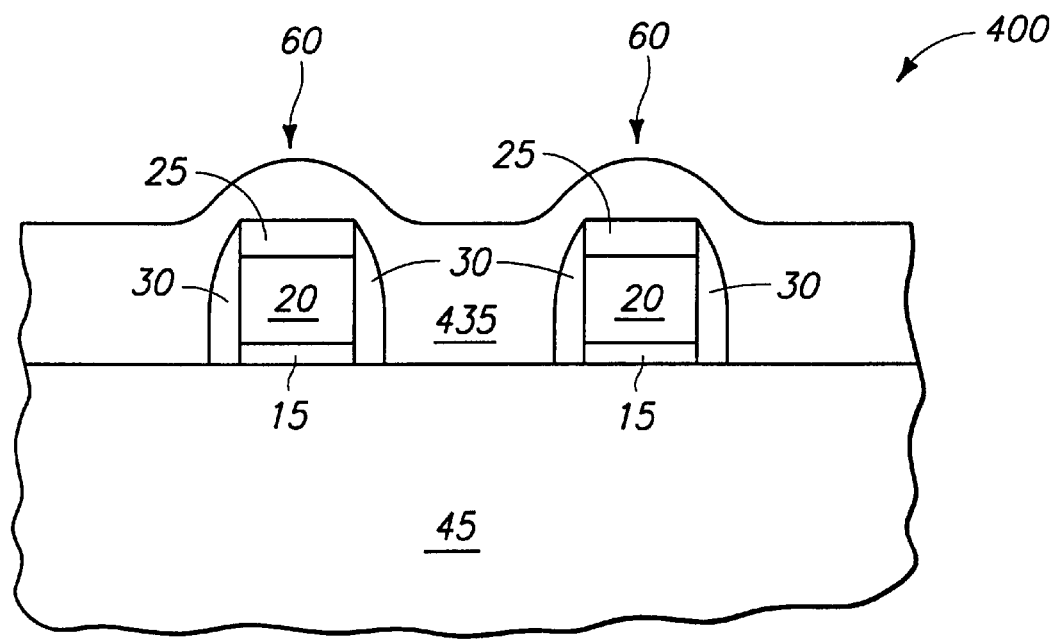
FIG. 4 is an enlarged sectional view of the wafer portion in FIG. 1 at a subsequent processing step.

Turning now to FIGS. 2–4, three wafer portions are shown exemplifying structures that may result from use of the above-described methods. In FIG. 2, wafer portion 200 is illustrated which includes the same structure depicted in FIG. 1, except that gap 55 of wafer portion 100 has been transformed into a reduced gap 255 by deposition of boron free material 235 in areas where substrate 45 was exposed. Notably, the thickness of boron free material 235 is less than the height of gap 55 and no deposition occurred on wordline constructions 60. Accordingly, the aspect ratio of gap 255 may be less than the aspect ratio of gap 55, and yet boron free material 235 protecting against boron diffusion from any subsequently deposited insulation layer is provided.

As an example, boron free material 235 may have been formed by conducting SACVD under the conditions specified above where initial deposition rate is very low or approximately 0 Å/min initially over wordline constructions 60. The deposition may be stopped prior to the end of the time delay that marks the increase in deposition rate over word constructions 60 to prevent boron free material formation over word constructions 60.

FIG. 3 could exemplify formation of a wafer portion where the deposition continued past the time delay that marked the increase in deposition rate over wordline constructions 60. Thus, the average deposition rate over exposed portions of substrate 45 may be greater than the average deposition rate over wordline constructions 60. Such may produce a boron free material 335 having a greater thickness over gap 55 compared to the thickness over wordline constructions 60. Accordingly, wafer portion 300 of FIG. 3 illustrates a reduced gap 355 having an aspect ratio less than, or perhaps equal to, the aspect ratio of gap 55 of wafer portion 100 in FIG. 1. Depending on the original aspect ratio of gap 55 and the thickness of boron free material 335 on spacers 30, reduced gap 355 could have an aspect ratio greater gap 55. However, the aspect ratio of gap 355 would certainly be less than otherwise using a conventional deposition process.

Alternatively, boron free material 335 of wafer portion 300 could have been formed in a deposition process which did not have an initial time delay during which the deposition rate over wordline constructions 60 was very low or approximately 0 Å/min. Rather, the deposition process may have occurred substantially selectively to substrate 45 such that boron free material 335 simply deposited over substrate 45 at a higher instantaneous rate than over wordline constructions 60.

Turning to FIG. 4, a wafer portion 400 is illustrated including all the same elements of wafer portion 100 shown in FIG. 1, except that gap 55 has been filled with a boron free material 435. Notably, boron free material 435 completely fills the original gap 55 of wager portion 100. Gap 55 is completely filled and a portion of boron free material 435 extends over wordline constructions 60. Thus, a layer of insulation may subsequently be formed over wafer portion 400 without concern for the creation of undesirable voids in gaps having too high of an aspect ratio.

If boron free material 435 comprised PSG then, conceivably, boron free material 435 could simultaneously comprise an insulation layer, such as insulation layer 540 of wafer portion 500 in FIG. 5. Such may be less desirable if a portion of the boron free material extends over the wordline constructions or other device structure and if planarization is thus warranted. However, the height of a device structure and the deposition conditions could conceivably be coordinated. With coordination, gap 55 could become completely filled by boron free material at the point in processing where deposition of boron free material first begins to occur over the device structure. Thus, the boron free material may continue upward to a height suitable for boron free material to simultaneously function as a planarized insulation layer. One disadvantage of such a PSG insulation layer is that it might not be possible to reflow in the event that planarization is not initially achieved.

The thickness of any boron free material formed over substrate 45 to prevent boron diffusion into substrate 45 may vary widely depending upon the degree of protection desired for a particular application. Even a very thin layer of boron free material, such as 1.0 Å, may provide some protection from boron diffusion. However, generally, the more thick the boron free material the more protection it may provide from boron diffusion. For most applications, boron free material having a thickness of 100 to 300 Å in the area over an exposed portion of substrate 45 is sufficient. More specifically, a film thickness of 200 Å is most frequently selected.

Thus, assuming a 200 Å boron free material thickness, a 60 Å per minute deposition rate over substrate 45, and a 100 sec time delay before deposition over wordline constructions 60, the layer formed may have a structure similar to that shown in FIG. 3 for boron free material 335. That is, deposition may occur on substrate 45 within gap 55 illustrated in FIG. 1 without deposition of any substantial amount of material on wordline constructions 60 for the first 100 sec. Up to the time delay, the boron free material may have a structure similar to that shown for boron free material 235 in FIG. 2. Once processing continues beyond 100 sec, material may be deposited on wordline constructions 60 and over substrate 45 at the same deposition rate. Accordingly, the structure of the boron free material may resemble the structure of boron free material 335 shown in FIG. 3. After 200 sec, the 60 Å/min deposition rate may produce a boron free material thickness of about 200 Å in the area over substrate 45 and a thickness of about 100 Å over wordline constructions 60.

In the above example, reduced gap 355 would have a height about 200 Å less than the height of gap 55 and a width also about 200 Å less than the original width. If a conventional method were used instead to form boron free material 635 of wafer portion 600 in FIG. 6, then the height of gap 55 would be reduced by about 200 Å and the width would be reduced by about 400 Å.

Assuming gap 55 had a height of 0.125 micrometers ($\mu$m) and a width of 0.5 $\mu$m, the aspect ratio would be 0.25. Under the above example of reduced gap 355, aspect ratio would be reduced to 0.24 in forming the boron free material as described. A conventional process would increase the aspect ratio to 0.27. Assuming gap 55 had a height of 0.25 $\mu$m and a width of 0.5 $\mu$m, the aspect ratio would be 0.5. Under If the above example of reduced gap 355, aspect ratio would remain unchanged at 0.5. With a conventional process, aspect ratio would increase to 0.54. Assuming gap 55 had a height of 0.5 $\mu$m and a width of 0.25 $\mu$m, aspect ratio would equal 2.0, which the above example of reduced gap 355 would increase to 2.1 and a conventional process would increase to 2.4.

Accordingly, comparing the above example to a conventional process, aspect ratio produced by a conventional process is higher in each case than aspect ratio produced by the present invention. For gaps having an initial aspect ratio of 0.25, the above example reduced the aspect ratio while a conventional process increased aspect ratio. For an initial aspect ratio of 0.5, the above example did not change aspect ratio and a conventional process increased aspect ratio. For an initial aspect ratio of 2.0, the above example increased aspect ratio, but to a lesser degree than aspect ratio would be increased by a conventional process. One of ordinary skill will recognize that such comparisons are dependent on the particular numeric values selected for gap dimensions and boron free material thicknesses. Accordingly, they are provided for illustration and not necessarily to define a mathematical relationship.

Understandably, whether an aspect ratio of a gap is increased or decreased may depend upon the magnitude of the aspect ratio originally as well as the magnitude of thickness for the boron free material over both substrate 45 and wordline constructions 60 or other device structure. However, the aspect ratio of a reduced gap, according to the present invention, bears the advantage of being less than the aspect ratio of a reduced gap produced by a conventional process.

The methods according to the present invention discussed above may be followed by deposition of a boron containing silicon oxide comprising material, such as BPSG, to form an insulation layer. Such a deposition of insulation layer 540 over wafer portion 200 of FIG. 2 may produce wafer portion 500 of FIG. 5. Generally, depositing an insulation layer may occur at the same deposition rate over any partially or completely filled gap and any wordline constructions or other device structure. Nevertheless, it remains conceivable that deposition could occur in some selective fashion in keeping with the principles described above. It may further be desirable to deposit the insulation layer in situ in the same deposition chamber where any boron free material was formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method for filling structural gaps comprising:

forming a device structure having a gap with a bottom border comprising a first material and side borders at least partially comprising a second material of different composition than the first material;

depositing a substantially boron free barrier layer at a first average deposition rate over the first material of the bottom border, the same barrier layer being deposited at a second average deposition rate less than the first average deposition rate over the second material of the side borders; and forming a layer of an insulation material comprising a dopant over the barrier layer.

2. The method of claim 1 wherein the first material comprises a semiconductive material substrate on which the device structure is formed.

3. The method of claim 1 wherein the first material comprises silicon and is semiconductive.

4. The method of claim 1 wherein the second material comprises silicon nitride.

5. The method of claim 1 wherein the barrier layer comprises a silicon oxide.

6. The method of claim 1 wherein the insulation material comprises a borophosphosilicate glass.

7. The method of claim 1 wherein the device structure comprises a pair of wordline constructions and the side borders comprise opposing sidewall spacers of the pair.

8. The method of claim 1 wherein the barrier layer does not completely fill the gap.

9. The method of claim 1 wherein the second average deposition rate is initially approximately zero Å/min and begins to increase after a time delay.

10. The method of claim 9, wherein the time delay is greater than 5 seconds.

11. The method of claim 9, wherein the time delay is greater than 100 seconds.

12. The method of claim 1 wherein the depositing the barrier layer comprises a sub-atmospheric chemical vapor deposition occurring at a pressure of about 400 to 760 Torr and a temperature of about 350 to 600 Celsius while providing about 200 to 800 milligram/minute of a tetraethylorthosilicate comprising liquid and providing about 4.5 to 7 standard liters/minute of an ozone and oxygen comprising gas.

13. The method of claim 1 wherein the depositing the barrier layer occurs in a thermal chemical vapor deposition chamber and the forming the insulation material occurs in situ in the chamber.

14. The method of claim 1 wherein the forming the layer of insulation material comprises depositing the layer.

15. A semiconductive processing method for filling structural gaps comprising:

forming a device structure having a gap with a bottom border comprising a first material and side borders at least partially comprising a second material of different composition than the first material, the gap having a first aspect ratio;

forming a substantially boron free barrier layer substantially selectively, at least initially, to the first material to form a reduced gap having a second aspect ratio less than or equal to the first aspect ratio; and forming a layer of an insulation material comprising a dopant over the barrier layer.

16. The method of claim 15 wherein the bottom border of the gap is defined entirely by a silicon substrate and the side borders of the gap are defined entirely by silicon nitride encapsulation over conductive components of the device structure.

17. The method of claim 15 wherein the forming the barrier layer comprises depositing the barrier layer.

18. The method of claim 15 wherein the forming the barrier layer comprises a sub-atmospheric chemical vapor deposition.

19. The method of claim 15 wherein the barrier layer does not completely fill the gap.

20. The method of claim 15 wherein the forming the barrier layer occurs over the first material compared to the second material at an average selectivity ratio greater than 1.

* * * * *

UNITED STATES PATENT AND TRADEMARK OFFICE
CERTIFICATE OF CORRECTION

PATENT NO. : 6,500,730 B1
DATED : December 31, 2002
INVENTOR(S) : Chris W. Hill

It is certified that error appears in the above-identified patent and that said Letters Patent is hereby corrected as shown below:

Column 2,
Line 47, delete the "." after the word -- substrate" --.

Column 3,
Line 18, replace ".Similarly" with -- . Similarly --.

Column 8,
Line 12, replace "Under If the" with -- Under the --.

Signed and Sealed this

Sixth Day of May, 2003

JAMES E. ROGAN
*Director of the United States Patent and Trademark Office*